United States Patent
Demaj et al.

(10) Patent No.: US 8,433,270 B1
(45) Date of Patent: Apr. 30, 2013

(54) METHOD FOR TUNING AN OSCILLATOR FREQUENCY AND DEVICE IMPLEMENTING THE METHOD

(75) Inventors: Pierre Demaj, Nice (FR); Philippe Thierion, Nice (FR)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/308,346

(22) Filed: Nov. 30, 2011

(30) Foreign Application Priority Data

Nov. 8, 2011 (EP) .................................. 11306452

(51) Int. Cl.
*H04B 1/18* (2006.01)
*H04B 7/00* (2006.01)

(52) U.S. Cl.
USPC .................. 455/192.2; 455/257; 455/266

(58) Field of Classification Search ............... 455/192.1, 455/192.2, 255, 257, 258, 259, 260, 264, 455/265, 266; 375/344
See application file for complete search history.

(56) References Cited

U.S. PATENT DOCUMENTS

| | | | |
|---|---|---|---|
| 5,280,644 A * | 1/1994 | Vannatta et al. | 455/265 |
| 5,659,884 A | 8/1997 | Daughtry, Jr. | |
| 6,233,292 B1 | 5/2001 | Van Veldhuizen | |
| 6,363,126 B1 * | 3/2002 | Furukawa et al. | 375/344 |
| 7,012,563 B1 | 3/2006 | Bustamante et al. | |
| 7,579,919 B1 | 8/2009 | Cao | |
| 2007/0127611 A1 | 6/2007 | Chong et al. | |
| 2010/0201412 A1 | 8/2010 | Tsukio et al. | |

FOREIGN PATENT DOCUMENTS

| | | |
|---|---|---|
| EP | 0599414 A2 | 6/1994 |
| EP | 1816749 A1 | 8/2007 |

* cited by examiner

*Primary Examiner* — Nguyen Vo
(74) *Attorney, Agent, or Firm* — Howison & Arnott, L.L.P.

(57) ABSTRACT

A method for tuning an oscillator frequency produced in a radio-receiver chain is based on a slope analysis of a residual difference between the oscillator frequency and a carrier frequency of a radio-received signal. Depending on the slope value calculated, a bandwidth of a low-pass time-filtering that is effective for the frequency difference is increased or set back to a default value. The method provides an improved trade-off between tuning precision and dynamic behavior when the frequency difference drifts rapidly.

12 Claims, 3 Drawing Sheets

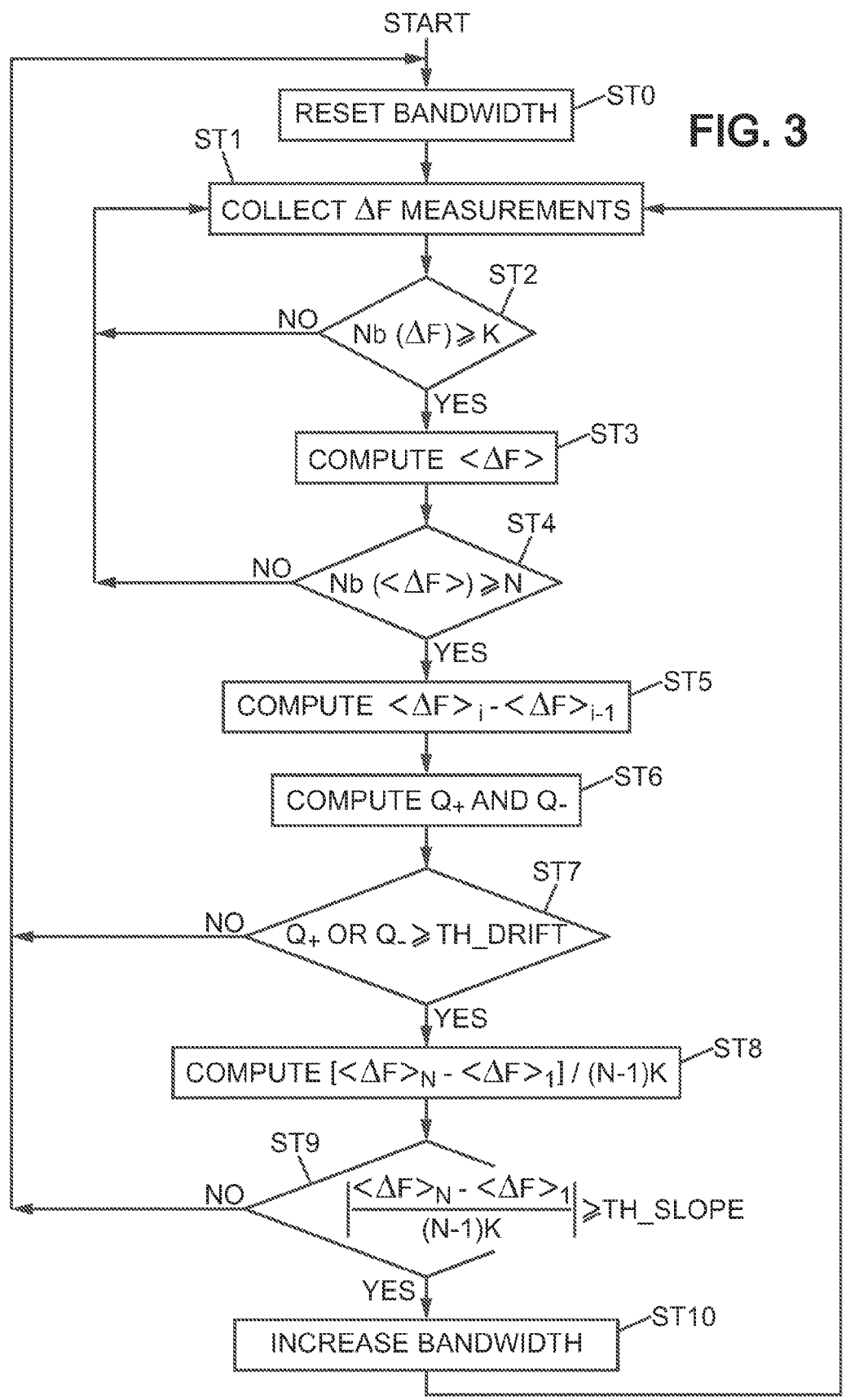

METHOD FOR TUNING AN OSCILLATOR FREQUENCY AND DEVICE IMPLEMENTING THE METHOD

CROSS-REFERENCE TO RELATED APPLICATIONS

This application claims benefit of European Application Serial No. 11306452.1, filed Nov. 8, 2011, entitled METHOD FOR TUNING AN OSCILLATOR FREQUENCY AND DEVICE IMPLEMENTING THE METHOD, the specification of which is incorporated herein by reference in its entirety.

TECHNICAL FIELD

The invention relates to a method for tuning an oscillator frequency and an electronic device for a radio-receiver chain which implements this method. It may be useful in particular when the device is intended for a mobile user equipment which operates according to the protocol "High Speed Downlink Packet Access" (HSDPA) as specified in the release 5 of the WCDMA—3GPP standard ("Wideband-Code Division Multiple Access—3GPP").

BACKGROUND

An electronic device for a radio-receiver chain, for example for a user's mobile communication equipment, may include an oscillator unit which produces an oscillator frequency. The oscillator unit may include a digitally-controlled crystal oscillator, which is arranged to produce an oscillator signal having an oscillator frequency. Such an electronic radio-receiver device may also include an automatic frequency control (AFC) module, which is arranged to analog-tune the digitally-controlled crystal oscillator so as to reduce the frequency difference between the oscillator frequency and a carrier frequency of a radio-received signal.

Such a digitally-controlled crystal oscillator has the advantage of having a low cost price, but the oscillator frequency as produced directly by such a digitally-controlled crystal oscillator may exhibit frequency-drift over time. Such drift may be due to temperature variation of the oscillator, in particular when the user equipment is transmitting data uplinks with a high transmission rate. Indeed, such high transmission rates cause a power amplifier of the mobile user equipment to rise in temperature, which in turn causes the temperature of the digitally-controlled crystal oscillator to increase. But, the digitally-controlled crystal oscillator is usually devoid of any temperature variation compensation system. So, the oscillator frequency increases as a consequence of the rise of the oscillator temperature. The amplitude of such frequency increase may be up to 20 Hz (Hertz). Then, received data from high transmission rate radio-received signals are extremely sensitive to any mismatch existing between the oscillator frequency and the carrier frequency. However, the drift of the oscillator frequency which is produced by the digitally-controlled crystal oscillator may also have many causes other than temperature variations.

In addition, the carrier frequency of the radio-received signal may also change in time, depending on the quality of the radio-transmission between the mobile user equipment and a node B from which the radio signal originates. As a consequence of the variations of both the oscillator frequency produced by the oscillator unit and the carrier frequency of the radio-received signal, an apparent drift occurs for due to the difference between these oscillator frequency and carrier frequency. But for obtaining a symbol decoding with a minimum error rate by the radio-receiver chain of the mobile user equipment, it is essential to reduce the difference between the oscillator frequency and the carrier frequency as much as possible.

To this purpose, it is also known that a radio-receiver chain to may additionally comprise a baseband frequency corrector (BFC) module. Such baseband frequency corrector module may be arranged for digitally tuning the oscillator unit, so that the oscillator frequency matches the carrier frequency with residual frequency difference further reduced compared to the efficiency of the automatic frequency control module alone.

Implementation of the HSDPA protocol requires very fine tuning of the oscillator frequency so as to match the carrier frequency, in particular because of the very high downlink transmission rate of the High Speed Dedicated Shared Channel (HS-DSCH). Even a drift amplitude of a few Hertz difference between the oscillator frequency and the carrier frequency has negative impact on the error rate of the symbol decoding.

Also known is that the automatic frequency control module when implemented without a baseband frequency corrector module, or the combination of an automatic frequency control module with the baseband frequency corrector module, operates as a low-pass time-filtering of the frequency difference between the oscillator frequency and the carrier frequency. This time-filtering creates a trade-off between low residual frequency difference and efficiency of the reduction of this frequency difference when drift occurs for the frequency difference with a non-zero drift rate. Put another way, a trade-off occurs between the static performance and the dynamic behaviour for reducing the difference between the oscillator frequency and the carrier frequency.

Then, what is needed is a technique and device that improves the efficiency of controlling the oscillator frequency to better match the carrier frequency, in particular in dynamic conditions.

SUMMARY

To this end, one aspect of the invention proposes a method for tuning an oscillator frequency within a radio-receiver chain with a baseband frequency corrector module. An exemplary method comprises the following steps:
(1) measuring repeatedly the frequency difference between the oscillator frequency produced by the oscillator unit and the carrier frequency of the radio-received signal;
(2) averaging the measurement results which are obtained successively for the frequency difference; and
(3) if the averaged measurement results that are obtained successively for the frequency difference exhibit an absolute slope value higher than or equal to a positive slope threshold, then increasing the bandwidth of the low-pass time-filtering of the frequency difference, as this time-filtering is being produced by the automatic frequency control module alone or in combination with the baseband frequency corrector module.

Thus, such an aspect of the invention proceeds by adapting the bandwidth of the time-filtering effective for the frequency difference based on the drift rate of this frequency difference. A larger low-pass bandwidth is selected when the drift of the frequency difference is observed to be more rapid. In particular, a drift which is caused by a temperature increase of the oscillator unit can be compensated efficiently in this way. In addition, the average calculation performed in step (2) filters out non-significant random drifts which are due to noise.

Embodiments of the invention are compatible with using a low-cost digitally-controlled crystal oscillator. Preferably, they are implemented when the baseband frequency corrector module is present, for still higher efficiency.

Another advantage of embodiments of the invention results from the possibility of implementation without modifying the design of the radio-receiver chain, but only by adding a suitable means for performing the additional steps (1) to (3). Furthermore, these means for performing steps (1) to (3) may be software-type, which leads to reduced additional costs.

According to one embodiment of the invention, the increase of the bandwidth of the low-pass time-filtering of the frequency difference may be performed in step (3) only if a further condition is met. It may be performed if a count of positive ones among variations between two averaged measurement results, which are obtained successively, or another count of those of these variations that are negative, is higher than or equal to a drift threshold, in addition to the condition that the absolute slope value of the averaged measurement results is to be higher than or equal to the slope threshold.

In some embodiments of the invention, the slope value for the averaged measurement results obtained successively for the frequency difference may be calculated in step (3) over N averaged measurement results as a difference between an Nth and a first one of the N averaged measurement results, divided by N. Here N is an integer superior than or equal to two. Such implementation of the invention is easy, and it is rapid to execute during reception of the radio signal.

Embodiments of the invention may be completed in case the drift rate of the frequency difference decreases, so as to recover the initial precision in the matching between the oscillator frequency and the carrier frequency. To this purpose, step (3) may also comprise resetting the bandwidth of the low-pass time-filtering of the frequency difference down to a default bandwidth value, if the absolute slope value of the averaged measurement results obtained successively has become less than the slope threshold.

In varying embodiments of the invention, the following may be used, separately from one another or in combination of some of them:
- in step (2), the averaging of the measurement results for the frequency difference may be carried out with a fixed number of measurement results;
- in step (1), the frequency difference may be measured at a frame rate of the radio-received signal; and steps (1) to (3) may be carried out starting from a series of successive measurements of the frequency difference between the oscillator frequency and the carrier frequency, and this series may be reset when one or more of the following conditions occur:
  - when one measurement of the frequency difference appears to be invalid; or
  - when the automatic frequency control module has performed an analog tuning sequence since the last measurement of the frequency difference.

The method according to embodiments of the invention is particularly beneficial for a mobile user equipment which is adapted to receive radio signals in accordance with the "High Speed Downlink Packet Access" protocol. Indeed, the method provides further reduced error rate in the symbol decoding, although the downlink reception rate may be very high.

Other aspects of the invention propose an electronic device for a radio-receiver chain, which includes an oscillator unit and an automatic frequency control module, with the oscillator unit comprising itself a digitally-controlled crystal oscillator. According to these exemplary invention aspects, the device may further comprise a measurement module, an averaging module and a bandwidth adaptor adapted for performing steps (1) to (3) as described earlier, possibly with at least one of the improvements also described. In other exemplary embodiments, when the device comprises an analog block and a digital block, the oscillator unit is comprised in the analog block and the modules for performing the steps (1) to (3) are comprised in the digital block. Optionally, the device for a radio-receiver chain may still further include a baseband frequency corrector module.

Still other aspects of the invention propose a computer program product which comprises a computer readable medium, having thereon a computer program comprising program instructions. The computer program is loadable into a data-processing unit that is adapted to cause execution of the method as described above when the computer program is run by the data-processing unit.

BRIEF DESCRIPTION OF THE DRAWINGS

For a more complete understanding, reference is now made to the following description taken in conjunction with the accompanying Drawings in which:

FIG. 3 is a flowchart for an embodiment of the invention.

DETAILED DESCRIPTION

Figure 1:
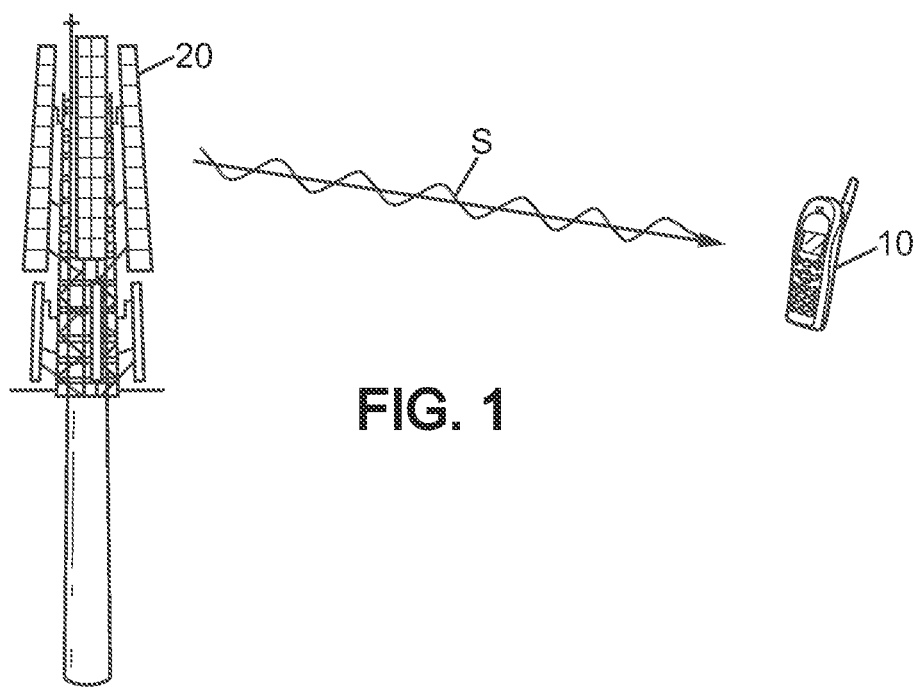
FIG. 1 illustrates a downlink transmission of a radio-signal to a mobile user equipment implementing embodiments of the invention.

Referring now to the drawings, wherein like reference numbers are used herein to designate like elements throughout, the various views and embodiments of a method for tuning an oscillator frequency and device implementing the method are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Embodiments of the invention are now described in detail, and include using a baseband frequency corrector module. But, the baseband frequency corrector module is optional so that other invention embodiments may be implemented without the radio-receiver chain including a baseband frequency corrector module.

According to FIG. 1, a mobile user equipment 10 can receive a radio signal S from a node B with reference number 20. Such transmission of signal S from the node B 20 to the mobile user equipment 10 is called a downlink, as opposed to reverse transmission from the mobile user equipment 10 to the node B 20, which is called an uplink. The mobile user equipment 10 may be a mobile phone terminal or a touchpad internet terminal for example. The communication considered in this specification may implement the UMTS standard, or the protocol HSDPA, although it is not limited to this transmission system.

The radio signal S is comprised of a carrier with a defined carrier frequency, and modulation of this carrier in accordance with symbols to be transmitted. The carrier frequency of the signal S as being radio-received by the mobile user equipment 10 may vary, in particular, depending on radio transmission conditions existing between the node B 20 and the user equipment 10. These transmission conditions may include, in particular, a Doppler frequency shift due to a movement of the mobile user equipment 10.

Embodiments of the invention relate to the operation of the radio-receiver chain of the user equipment 10 when receiving the signal S. This radio-receiver chain is partially represented in FIG. 2. Obviously, it may comprise other modules in addition to those indicated, for example filters, demapper, de-interleaver, etc, but for the sake of clarity and because the operation of these other modules is not modified by implementing embodiments of the invention, they are not shown in FIG. 2. In a known manner, the modules of the radio-receiver chain are distributed within an analog block 11 and a digital block 12 of an electronic device.

The analog block 11 comprises an antenna 4 for sensing the radio signal S, an analog amplifier 5, and a down-converter 6 to produce in-phase sample I and quadrature sample Q. Also known is the operation of the down-converter 6, which mixes the radio signal S detected filtered and amplified with an oscillator signal FRQ received from a local oscillator unit 1, internal to the radio-receiver chain of the user equipment 10.

Figure 2:
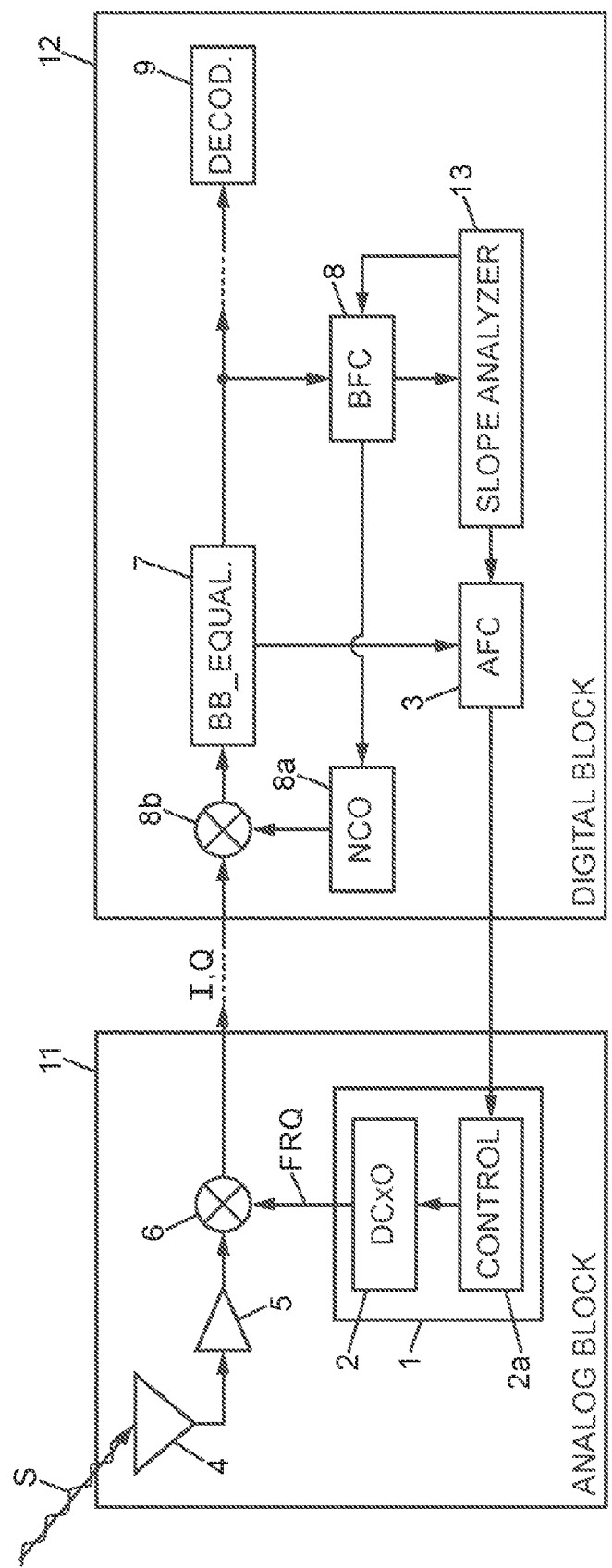
FIG. 2 represents several modules of a radio-receiver chain of the mobile user equipment of FIG. 1, which are involved by embodiments of the invention.

Internally to the analog block 11, the oscillator unit 1 comprises itself a crystal oscillator 2 and a controller 2a which is noted CONTROL in FIG. 2 and connected to an analog control terminal of the crystal oscillator 2. The crystal oscillator 2 produces the oscillator signal FRQ with an oscillator frequency intended to match as much as possible the carrier frequency of the radio signal S. The crystal oscillator 2 is of DCxO-type, standing for digitally-controlled crystal oscillator. Such crystal oscillator is not compensated for temperature variations, leading to variations in the frequency of the signal produced. The operation of the DCxO oscillator 2, in particular its oscillator frequency, can be tuned using the controller 2a.

The digital block 12 comprises a baseband equalizer 7, noted BB EQUAL, a symbol decoder 9, noted DECOD, and an automatic frequency control module 3, noted AFC. The I- and Q-samples are transmitted to the baseband equalizer 7, possibly using an analog-to-digital converter (not shown) intermediate between the analog block 11 and the digital block 12. Then the I- and Q-samples are further processed by the digital block 12, up to the decoder 9.

An input of the automatic frequency control module 3 is connected to an output of the baseband equalizer 7 for receiving an estimation of the difference existing between the oscillator frequency and the carrier frequency. The automatic frequency control module 3 is connected in turn to the controller 2a, for tuning the DCxO oscillator 2 so as to reduce the frequency difference between the oscillator signal FRQ and the received signal S.

Such an arrangement of the radio-receiver chain of the oscillator unit 1 produces a low-pass time-filtering of the difference between the oscillator frequency and the carrier frequency which is used for tuning the oscillator frequency in accordance with the carrier frequency. Thus, variations of the frequency difference, which exhibit a drift rate above a low-pass bandwidth value, are poorly effective or not effective for the tuning of the oscillator frequency.

In addition, there is a lower limit for the value of the frequency difference, for the automatic frequency control module 3 to trigger an analog tuning of the DCxO oscillator 2. As a consequence, even for slow variations of the carrier frequency, the oscillator frequency as produced by the oscillator unit 1 has a step-wise variation.

For smoothing this stepwise variation of the oscillator frequency, the digital block 12 may also comprise a baseband frequency corrector module 8, noted BFC. This baseband frequency corrector module 8 is digitally operating, and is sensitive to frequency difference values which are below the triggering limit of the automatic frequency control module 3. It is usually connected to a digital control terminal of oscillator unit 1 or of the automatic frequency control module 3. In this way, the oscillator frequency can be produced to match the carrier frequency with less residual difference. But such residual difference may still impact the error rate of the symbol decoding which is performed by the decoder 9. Invention embodiments further improve the tuning of the oscillator frequency according to the carrier frequency, in particular when this latter is time-varying.

Although the baseband frequency corrector module 8 is optional for implementing the invention, it is incorporated therein because of producing finer frequency tuning When used, the baseband frequency corrector module 8 participates to the time-filtering which impacts the difference between the oscillator frequency and the carrier frequency, which difference is effective for the frequency tuning. Thus, the bandwidth to be considered for this time-filtering is the bandwidth resulting from the combined operations of both the automatic frequency control module 3 and the baseband frequency corrector module 8.

The digital block 12 may further comprise an additional loop, for separating the in-phase sample I and quadrature sample Q in an improved extent. To this purpose, the I- and Q-samples are further mixed with another signal produced by a numerically controlled oscillator 8a, noted NCO, using an additional mixer 8b internal to the digital block 12. The frequency of the signal produced by the numerically controlled oscillator 8a is digitally controlled by the baseband frequency corrector module 8.

According to embodiments of the invention, the digital block 12 comprises an additional module 13, which may be software-implemented. This additional module 13 cooperates with the baseband frequency corrector module 8 for transmitting to the automatic frequency control module 3 control signals for reducing the residual difference between the oscillator frequency and the carrier frequency. The frequency difference measurements used by the additional module 13 may originate from the baseband frequency corrector module 8, or from other modules within the digital block 12. The output of the additional module 13 is connected for further controlling the DCxO oscillator 2, via the controller 2a and possibly in combination with the control connection from the automatic frequency control module 3. When using the additional digital loop with the numerically controlled oscillator 8a and the mixer 8b, the additional module 13 also participates in still further improving the separation of the I- and Q-samples.

In FIG. 2, the additional module 13 introduced by the present invention is noted SLOPE ANALYZER. Its operation is now described in connection with FIG. 3 for an exemplary implementation of the invention. It may be soft- or hard-ware implemented.

Referring now to FIG. 3, the method of the invention starts with collecting a series of N averaged measurement results for the difference between the oscillator frequency and the carrier frequency. This frequency difference is measured or estimated within the digital block 12 by carrying out the following steps:

ST0: resetting to a default bandwidth value of the frequency difference low-pass bandwidth which is effective for tuning the DCxO oscillator 2;

ST1: collecting successive measured values for the difference $\Delta F$ between the oscillator frequency and the carrier frequency;

ST2: testing whether the number Nb(ΔF) of ΔF values measured is sufficient for performing an average calculation;

ST3: calculation of the average value <ΔF> for the K last ΔF values measured, K being an integer higher than or equal to two; and ST4: testing whether the number Nb(<ΔF>) of average values <ΔF> is sufficient.

In step ST0, the default bandwidth value may be preferably selected to ensure fine matching of the oscillator frequency with the carrier frequency in stationary conditions.

In step ST1, the frequency difference ΔF may be measured continually during the reception of the radio signal S, for example each time a new signal frame is processed.

In steps ST2 and ST3, the number K of the ΔF values, which are successively measured and collected for calculating the next average value <ΔF> may be five, for example, corresponding to one value collected every 2 ms (millisecond) for the frequency difference.

This sequence of collecting successive average values for the frequency difference may be stopped and reset to step ST0 upon each operation of the automatic frequency control module 3, which changes the operation set point of the DCxO oscillator 2. It may also be stopped and reset upon detecting that the measurement result obtained for the current execution of step ST1 is not valid.

After step ST4 has been performed successfully, N values are available for the average frequency difference. These average values are denoted $<\Delta F>_i$, with the integer index i varying from 1 to N, N possibly being equal to eight, for example. Two average values $<\Delta F>_i$, which are calculated successively may relate to respective sets of measured ΔF values which are separate but collected after one another. Alternatively, each average value $<\Delta F>_i$ may be calculated based on the K last ΔF measurement values collected, after a new ΔF measurement has been achieved.

Then the successive variations of the average values $<\Delta F>_i$ are calculated in step ST5, leading to N−1 signed variation values $<\Delta F>_i-<\Delta F>_{i-1}$, i varying from 2 to N. Step ST6 consists thereafter in counting those among the variation values $<\Delta F>_i<-\Delta F>_{i-i}$ which are strictly positive, leading to count result $Q_+$. Similarly, Q− is the number of the variation values $<\Delta F>_i-<\Delta F>_{i-i}$ which are strictly negative.

Steps ST7 to ST10 relate to possible increase of the low-pass bandwidth for the frequency difference used for tuning the DCxO oscillator 2, when the difference between the oscillator frequency and the carrier frequency is observed to vary rapidly.

Step ST7 sets a first condition for increasing the bandwidth, based on the count results $Q_+$ and $Q_-$. One of these latter count results needs to be higher than or equal to a first threshold for the step sequence to be run further. This first condition requires that a major number of variation values $<\Delta F>_i-<\Delta F>_{i-i}$ is of same algebraic sign, meaning that the successive average values $<\Delta F>_i$ exhibit a main tendency to increasing or decreasing. The first threshold is called drift threshold and noted TH_DRIFT, and may be equal to 0.75×N, for example. In case this first condition is not met, the step sequence may be started again from step ST0, with resetting of the low-pass bandwidth back to its default value.

In alternative embodiments of the invention, the first condition tested in step ST7 may relate to the absolute difference between both count results $Q_+$ and $Q_-$. It may require that this absolute difference $|Q_+-Q-|$ is higher than or equal to an appropriate threshold value before proceeding further with step ST8, otherwise the sequence is also started again with step ST0.

If step ST7 is passed, then step ST8 comprises in calculating a global variation from first to last average value: $<\Delta F>_N - <\Delta F>_1$, and then calculating the slope value $[<\Delta F>_N - <\Delta F>_1]/[(N-1)\times K]$.

Step ST9 sets a second condition for increasing the bandwidth, based on the absolute value of the slope calculated in step ST8. The absolute value for slope $[<\Delta F>_N - <\Delta F>_1]/[(N-1)\times K]$ is to be higher than or equal to a second threshold which is strictly positive, for passing step ST9. This second threshold is called slope threshold and noted TH_SLOPE. For example, this slope threshold TH_SLOPE may be set to 12.6 Hz/s (Hertz per second). If the second condition of step ST9 is not met, the step sequence may be started again from step ST0, with resetting of the low-pass bandwidth back to its default value.

If the second condition of step ST9 is met, then the bandwidth is increased in step ST10. In some implementations of the invention, this increase may be produced by changing at least one filter coefficient for the filter which is effective for the frequency difference feedback. The bandwidth increase may be stepwise with fixed increment, or with a varying increase magnitude as a function of the calculated absolute slope value $|<\Delta F>_N - <\Delta F>_1|/[(N-1)\times K]$. Optionally or because of a practical matter, a maximum limit may exist for the bandwidth value. The bandwidth increase which is controlled in step ST10 may be implemented by controlling the baseband frequency corrector module 8. Thus, the dynamic performance of the oscillator frequency control as a function of the carrier frequency is improved. The operation of the radio-receiver chain is then continued with the increased bandwidth value, and the step sequence of FIG. 3 is repeated from step ST1.

When the invention is implemented with a radio-receiver chain devoid of a baseband frequency corrector module, the additional module 13 may trigger the bandwidth increase by acting directly onto the automatic frequency control module 3.

In the invention implementation just described, the bandwidth value is tuned based directly on the slope value calculated. In alternative implementations, the bandwidth tuning may be performed based on a linear prediction of the evolution of the frequency difference, the prediction being based on successive calculated slope values.

In still further invention implementations, the bandwidth value may be decreased with a process similar to that described above for a bandwidth increase, when a slowdown is observed for the drift of the difference between the oscillator frequency and the carrier frequency.

It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A method for tuning an oscillator frequency, produced by an oscillator unit within a radio-receiver chain, in accordance with a carrier frequency of a radio-received signal, wherein the oscillator unit comprises a digitally-controlled crystal oscillator adapted to produce an oscillator signal with said oscillator signal having the oscillator frequency; and wherein the radio-receiver chain also comprises an automatic frequency control module adapted to analog-tune the digitally-controlled crystal oscillator so as to reduce a frequency difference between the oscillator frequency and the carrier frequency, wherein the automatic frequency control module is further adapted to perform a low-pass time-filtering of said frequency difference, the method comprising:

(1) measuring repeatedly the frequency difference;
(2) averaging the successively obtained frequency difference measurement results; and
(3) when the averaged measurement results obtained successively for the frequency difference exhibit an absolute slope value higher than or equal to a positive slope threshold, then increasing the bandwidth of the low-pass time-filtering of the frequency difference.

2. The method according to claim 1, wherein the radio-receiver chain further comprises a baseband frequency corrector module adapted to digitally tune the oscillator unit so as to further reduce the frequency difference between the oscillator frequency and the carrier frequency, and wherein the low-pass time-filtering of said frequency difference is a result of the from combined operation of both the automatic frequency control module and the baseband frequency corrector module.

3. The method according to claim 1 wherein in step (3), the increasing of the bandwidth of the low-pass time-filtering of the frequency difference is performed only when a count of positive ones among variations between two averaged measurement results obtained successively, or another count of negative ones among said variations, is higher than or equal to a drift threshold, in addition to the absolute slope value of said averaged measurement results being higher than or equal to the slope threshold.

4. The method according to claim 1, wherein the slope value for the averaged measurement results obtained successively for the frequency difference, is calculated in step (3) over N averaged measurement results as a difference between an Nth and a first one of said N averaged measurement results, divided by N, with N being an integer superior than or equal to two.

5. The method according to claim 1, wherein step (3) also comprises resetting the bandwidth of the low-pass time-filtering of the frequency difference down to a default bandwidth value, if the absolute slope value of the averaged measurement results obtained successively is less than the slope threshold.

6. The method according to claim 1, wherein in step (2), the averaging of the measurement results for the frequency difference is carried out with a fixed number of measurement results.

7. The method according to claim 1, wherein in step (1), the frequency difference is measured at a frame rate of the radio-received signal.

8. The method according to claim 1, wherein steps (1), (2), or (3) are carried out starting from a series of successive measurements of the frequency difference between the oscillator frequency and the carrier frequency, and said series is reset when at least one of the following conditions occurs:

when one measurement of said frequency difference appears to be invalid; or
when the automatic frequency control module has performed an analog tuning sequence since the last measurement of the frequency difference.

9. A computer program product comprising a computer readable medium, having thereon a computer program comprising program instructions, the computer program being loadable into a data-processing unit and adapted to cause execution of a method according to claim 1 when the computer program is run by the data-processing unit.

10. An electronic device for a radio-receiver chain, wherein the device comprises an oscillator unit adapted to produce an oscillator signal, and said oscillator unit comprises:

a digitally-controlled crystal oscillator arranged to produce the oscillator signal with said oscillator signal having a oscillator frequency; and wherein the electronic device comprises:

an automatic frequency control module adapted to analog-tune the digitally-controlled crystal oscillator so as to reduce a frequency difference between the oscillator frequency and a carrier frequency of a radio-received signal with a low-pass time-filtering of said frequency difference;
a measurement module adapted to repeatedly measure repeatedly the frequency difference;
an averaging module adapted for averaging the successively obtained measurement results of the frequency difference; and
a bandwidth adaptor adapted for increasing the bandwidth of the low-pass time-filtering of the frequency difference, and arranged for being activated when the averaged successively obtained measurement results for the frequency difference exhibit an absolute slope value higher than or equal to a positive slope threshold.

11. The device according to claim 10, further comprising a baseband frequency corrector module adapted to digitally tune the oscillator unit so as to further reduce the frequency difference between the oscillator frequency and the carrier frequency, wherein the low-pass time-filtering of said frequency difference results from a combined operation of both the automatic frequency control module and the baseband frequency corrector module.

12. The device according to claim 10, comprising an analog block and a digital block, and wherein:

the oscillator unit is comprised in the analog block, and
the measurement module for measuring the frequency difference, the averaging module for averaging the measurement results, and the bandwidth adaptor for increasing the bandwidth of the low-pass time-filtering of the frequency difference are comprised in the digital block.

* * * * *